United States Patent
Song et al.

(10) Patent No.: US 12,449,565 B2
(45) Date of Patent: Oct. 21, 2025

(54) WINDOW, AND DISPLAY DEVICE INCLUDING THE SAME

(71) Applicant: Samsung Display Co., Ltd., Yongin-si (KR)

(72) Inventors: Kicheol Song, Suwon-si (KR); Younjoeng Goh, Cheonan-si (KR); Hyosung Kim, Hwaseong-si (KR); Youngsang Park, Seoul (KR); Inseok Seo, Asan-si (KR); Youngwoo Choi, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/887,848

(22) Filed: Aug. 15, 2022

(65) Prior Publication Data
US 2023/0152495 A1 May 18, 2023

(30) Foreign Application Priority Data
Nov. 16, 2021 (KR) .......... 10-2021-0158028

(51) Int. Cl.
| | |
|---|---|
| *G02B 1/14* | (2015.01) |
| *C23C 14/06* | (2006.01) |
| *C23C 14/10* | (2006.01) |
| *C23C 16/30* | (2006.01) |
| *C23C 16/36* | (2006.01) |

(Continued)

(52) U.S. Cl.
CPC ............ *G02B 1/14* (2015.01); *C23C 14/0635* (2013.01); *C23C 14/0676* (2013.01); *C23C 14/10* (2013.01); *C23C 16/308* (2013.01); *C23C 16/36* (2013.01); *C23C 16/401* (2013.01); *G09F 9/301* (2013.01); *H10K 50/844* (2023.02)

(58) Field of Classification Search
CPC ... H10K 50/844; H10K 50/8445; C08J 7/046; C08J 7/048; C23C 16/308; C23C 16/345; C23C 16/401; C23C 14/0676; C23C 14/0652; G02B 1/14; G02B 1/18
See application file for complete search history.

(56) References Cited

U.S. PATENT DOCUMENTS 5,888,593 A * 3/1999 Petrmichl ............. C23C 16/513
427/574
8,840,997 B2   9/2014 Koyama et al.
(Continued)

FOREIGN PATENT DOCUMENTS

FR    2989692 A1 * 10/2013 .......... H01J 37/3277
JP    2012214356 A    11/2012
(Continued)

OTHER PUBLICATIONS

Machine translation of JPWO 2015/005421 A1, obtained from J-PlatPat.*
(Continued)

*Primary Examiner* — Z. Jim Yang
(74) *Attorney, Agent, or Firm* — CANTOR COLBURN LLP

(57) ABSTRACT

A window includes a base layer, and an inorganic film disposed directly on at least one selected from an upper surface and a lower surface of the base layer, where the inorganic film includes at least one selected from silicon oxy carbide, silicon oxy carbonitride, and silicon oxide.

16 Claims, 8 Drawing Sheets

(51) Int. Cl.
*C23C 16/40* (2006.01)
*G09F 9/30* (2006.01)
*H10K 50/844* (2023.01)

(56) References Cited

U.S. PATENT DOCUMENTS

| | | | |
|---|---|---|---|
| 11,161,323 B2 | 11/2021 | Choi et al. | |
| 2013/0334511 A1* | 12/2013 | Savas | H10K 59/8731 |
| | | | 257/432 |
| 2014/0054803 A1* | 2/2014 | Chen | H01L 21/56 |
| | | | 428/447 |
| 2014/0356549 A1* | 12/2014 | Varadarajan | H01L 21/02167 |
| | | | 427/249.15 |
| 2015/0064429 A1* | 3/2015 | Iwaya | B32B 7/12 |
| | | | 428/335 |
| 2016/0059261 A1* | 3/2016 | Nishio | B05D 3/065 |
| | | | 428/448 |
| 2016/0111684 A1* | 4/2016 | Savas | C23C 16/50 |
| | | | 438/26 |
| 2016/0149159 A1* | 5/2016 | Mori | H10K 50/844 |
| | | | 428/446 |
| 2016/0155986 A1* | 6/2016 | Ito | H10K 71/00 |
| | | | 438/126 |
| 2016/0236443 A1* | 8/2016 | Hwang | B32B 9/045 |
| 2017/0288170 A1* | 10/2017 | Ito | C23C 16/56 |
| 2017/0288171 A1* | 10/2017 | Ito | H10K 71/00 |
| 2018/0088392 A1 | 3/2018 | Park et al. | |
| 2018/0231692 A1 | 8/2018 | Ham et al. | |
| 2019/0081278 A1* | 3/2019 | Wittmann | H10K 50/15 |
| 2019/0088903 A1* | 3/2019 | Naganawa | H10K 50/8445 |
| 2020/0176249 A1* | 6/2020 | Nakatani | H01L 21/0228 |
| 2020/0332415 A1* | 10/2020 | Bhuyan | H01L 21/0228 |
| 2020/0354830 A1* | 11/2020 | Cho | H01L 21/0234 |
| 2020/0395569 A1 | 12/2020 | Song et al. | |
| 2021/0230747 A1* | 7/2021 | Zhang | C23C 16/06 |
| 2021/0289648 A1 | 9/2021 | Lee et al. | |
| 2022/0154337 A1* | 5/2022 | Zhang | C23C 16/36 |
| 2022/0234903 A1* | 7/2022 | Pearlstein | C23C 16/401 |

FOREIGN PATENT DOCUMENTS

| | | | | |
|---|---|---|---|---|
| JP | WO-2015005421 A1 * | 5/2015 | | G06F 9/5033 |
| JP | 2019050196 A | 3/2019 | | |
| KR | 1020180034056 A | 4/2018 | | |
| KR | 1020180094348 A | 8/2018 | | |
| KR | 1020200049942 A | 5/2020 | | |
| KR | 20200075796 A | 6/2020 | | |
| KR | 1020200143620 A | 12/2020 | | |
| KR | 1020210017816 A | 2/2021 | | |
| KR | 1020210086902 A | 7/2021 | | |
| KR | 20210116727 A | 9/2021 | | |
| TW | 201514333 A * | 4/2015 | | H10K 59/8793 |
| WO | WO-2015008708 A1 * | 1/2015 | | H10K 50/844 |

OTHER PUBLICATIONS

Machine translation of FR 2989692 A1.*
Machine translation of TW 2015/14333 A.*

* cited by examiner

WINDOW, AND DISPLAY DEVICE INCLUDING THE SAME

This application claims priority to Korean Patent Application No. 10-2021-0158028, filed on Nov. 16, 2021, and all the benefits accruing therefrom under 35 U.S.C. § 119, the content of which in its entirety is herein incorporated by reference.

BACKGROUND

1. Field

The disclosure herein relates to a window, and a display device including the window, and more particularly, to a flexible display device and a window included therein.

2. Description of the Related Art

Various types of electronic apparatus are widely used in various fields to provide image information, and recently, electronic apparatuses including a foldable or bendable flexible display device have been developed. Unlike a rigid display device, a flexible display device may have various shapes, such as folding, rolling, or bending shape, and thus is characterized by being portable regardless of the size of a display screen.

SUMMARY

In a flexible display device, stress may be applied to a window included therein due to repeated bending. Accordingly, it is desired to develop a window with strong durability despite repeated bending in various environments in which a display device is used.

The disclosure provides a window with improved durability in a reliable environment.

The disclosure also provides a display device including a window with durability in a reliable environment.

An embodiment of the invention provides a window including a base layer, and an inorganic film disposed directly on at least one selected from an upper surface and a lower surface of the base layer, where the inorganic film includes at least one selected from silicon oxy carbide, silicon oxy carbonitride, and silicon oxide.

In an embodiment, the inorganic film may include a first inorganic film disposed directly on the upper surface of the base layer, and a second inorganic film disposed directly on the lower surface of the base layer.

In an embodiment, the base layer may include polyethyleneterephthalate ("PET").

In an embodiment, the inorganic film may include, based on a total amount of atoms included in the inorganic film, oxygen atoms of about 57.1 at % to about 60.5 atomic percent (at %), silicon atoms of about 27.0 at % to about 30.6 at %, carbon atoms of about 6.0 at % to about 10.8 at %, and nitrogen atoms of about 3.4 at % to about 3.6 at %.

In an embodiment, a thickness of the inorganic film may be in a range of about 10 nanometers (nm) to about 50 nm.

In an embodiment, a thickness of the base layer may be in a range of about 30 micrometers (μm) to about 90 μm.

In an embodiment, a moisture absorption rate of the window under a first condition with a first temperature and a first humidity may be in a range of about 2.7% or less, where the first temperature may be about 60° C. or higher, and the first humidity may be about 70% or higher.

In an embodiment, the first temperature may be in a range of about 60° C. to about 85° C., and the first humidity may be in a range of about 70% to about 98%.

In an embodiment, the moisture absorption rate of the window may be a value measured after maintaining the window for about 3 hours under the first condition.

In an embodiment, the moisture absorption rate of the window may satisfy the following equation:

$$M = \frac{W_w - W_d}{W_d} \times 100.$$

In the equation above, M denotes the moisture absorption rate (%) of the window, $W_w$ denotes a weight of the window measured after being maintained for about 3 hours under the first condition, and $W_d$ denotes a weight of the window measured after being dried under a second condition with a second temperature and a second humidity, where the second temperature may be about 60° C. or higher, and the second humidity may be about 0%.

In an embodiment, when changed from the second humidity to the first humidity at a first rate under a second condition with a second temperature and a second humidity, a moisture expansion rate of the window may be about 8.03 parts per million per percent (ppm/%) or less, where the second temperature may be about 60° C. or higher, the second humidity may be about 0%, and the first rate may be about 1 percent per minute (%/min).

In an embodiment, a water vapor transmission rate may be about 1.73 grams per square meter per 24 hours (g/m²·day) or less under the first condition.

In an embodiment, a thermal expansion coefficient in a temperature section of about −40° C. to about 85° C. may be about 28.05 parts per million per degrees Celsius (ppm/° C.) or less.

In an embodiment, a glass transition temperature of the window may be about 87.2° C. or higher.

In an embodiment of the invention, a window includes a base layer, and an inorganic film disposed directly on at least one selected from an upper surface and a lower surface of the base layer, where a moisture absorption rate of the window is about 2.7% or less. In such an embodiment, the moisture absorption rate of the window satisfies the equation above.

In an embodiment of the invention, a display device include a display module, and a window disposed on the display module, where the window includes a base layer, and an inorganic film disposed directly on at least one selected from an upper surface and a lower surface of the base layer, where the inorganic film includes at least one selected from silicon oxy carbide, silicon oxy carbonitride, and silicon oxide.

In an embodiment, the inorganic film may include a first inorganic film disposed directly on the upper surface of the base layer, and a second inorganic film disposed directly on the lower surface of the base layer.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1A:
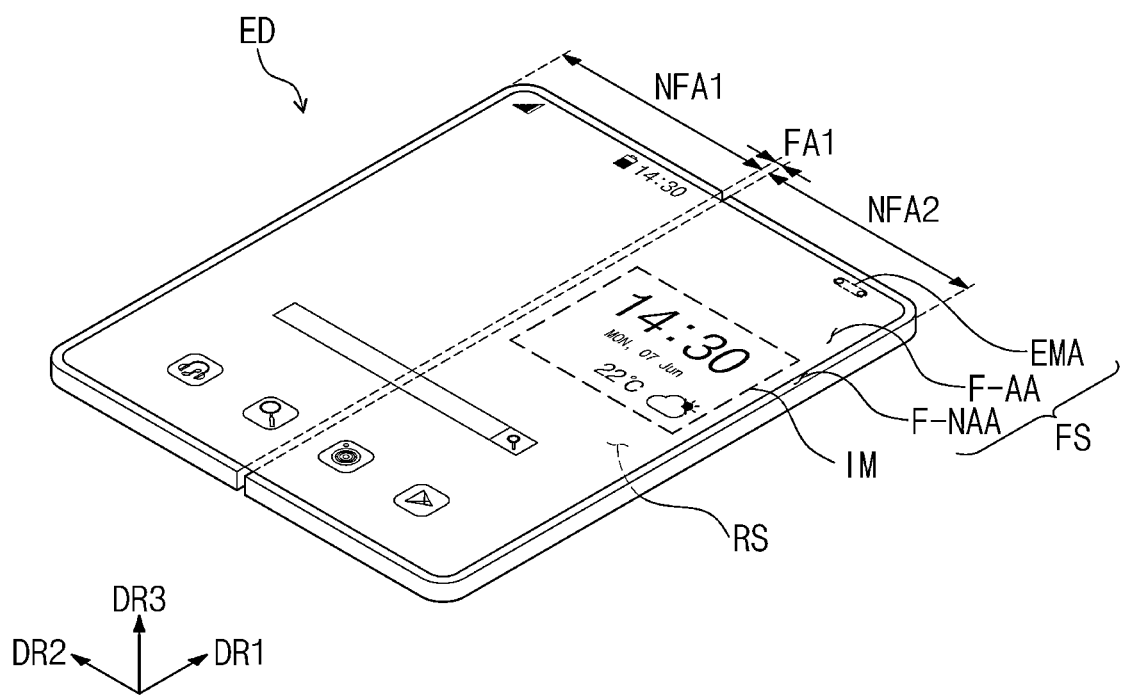
FIG. 1A is a perspective view showing an electronic apparatus in an unfolded state according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the disclosure, when an element (or an area, a layer, a portion, etc.) is referred to as being "connected to," or "coupled to" another element, it means that the element may be directly connected to/coupled to the other element, or that a third element may be disposed therebetween.

Like reference numerals refer to like elements. Also, in the drawings, the thickness, the ratio, and the dimensions of elements are exaggerated for an effective description of technical contents. The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which the invention pertains. It is also to be understood that terms such as terms defined in commonly used dictionaries should be interpreted as having meanings consistent with the meanings in the context of the related art, and should not be interpreted in too ideal a sense or an overly formal sense unless explicitly defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, Embodiments of the invention will be described with reference to the accompanying drawings.

Figure 1B:
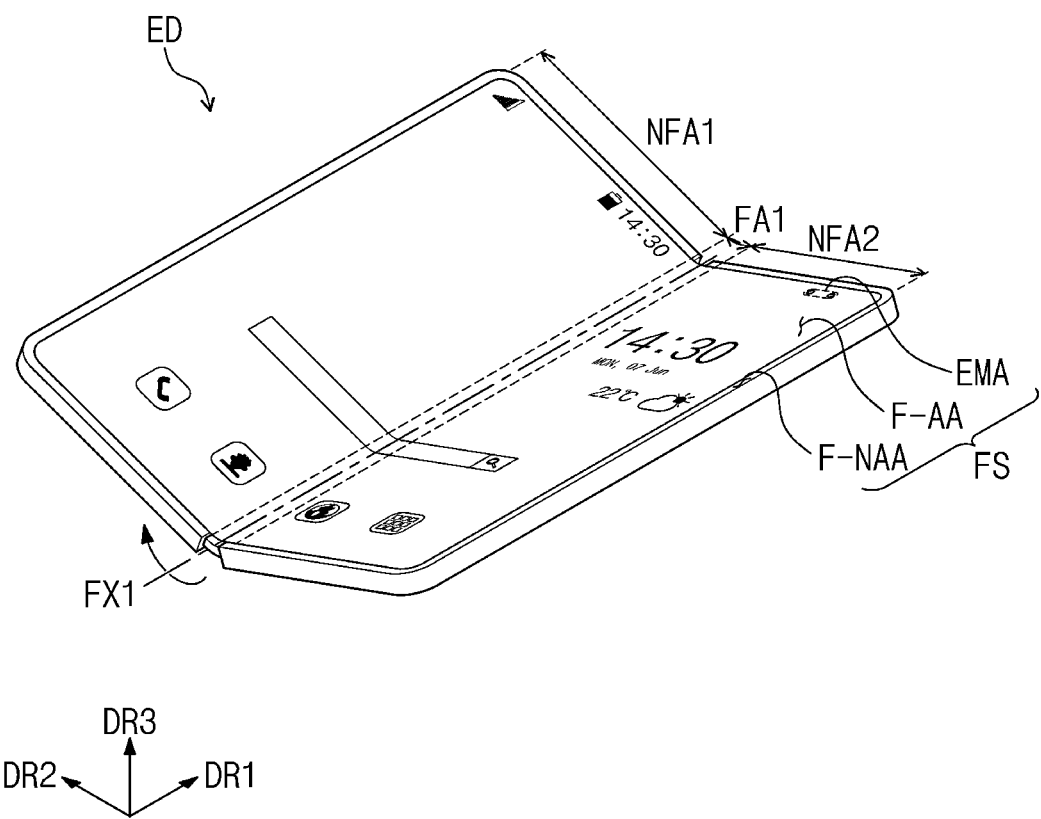
FIG. 1B is a perspective view showing an electronic apparatus of FIG. 1A in an in-folding process.
Figure 1C:
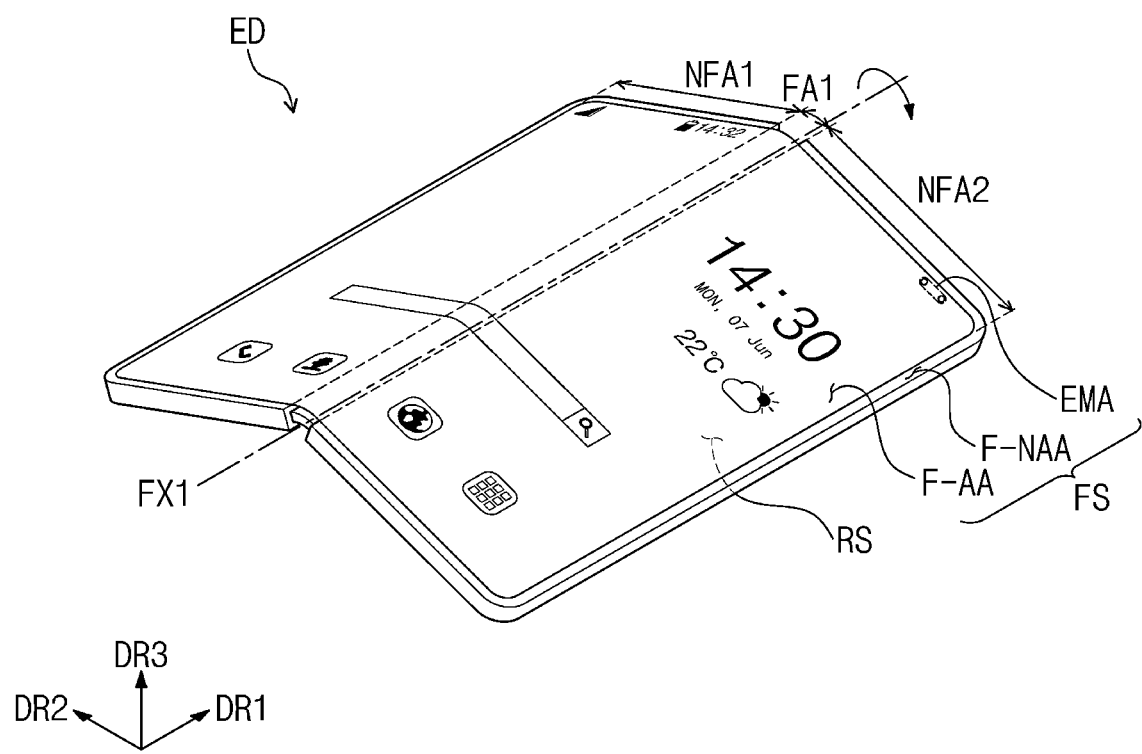
FIG. 1C is a perspective view showing an electronic apparatus of FIG. 1A in an out-folding process.

FIG. 1A is a perspective view showing an electronic apparatus in an unfolded state according to an embodiment. FIG. 1B is a perspective view showing an electronic apparatus of FIG. 1A in an in-folding process. FIG. 1C is a perspective view showing an electronic apparatus of FIG. 1A in an out-folding process.

An embodiment of an electronic apparatus ED may be a device activated according to an electrical signal. In an embodiment, for example, the electronic apparatus ED may be a mobile phone, a tablet computer, a car navigation system, a game console, or a wearable device, but the embodiment is not limited thereto. In the drawings, such as FIG. 1A and the like, embodiments where the electronic apparatus ED is a mobile phone are shown.

In FIG. 1A and the following drawings, a first direction DR1 to a third direction DR3 are illustrated, and directions indicated by the first to third directions DR1, DR2, and DR3 described in the disclosure are relative concepts, and may be converted to different directions.

Referring to FIG. 1A to FIG. 1C, an embodiment of the electronic apparatus ED may include a first display surface FS defined by the first direction DR1 and the second direction DR2 crossing the first direction DR1. The electronic apparatus ED may provide an image IM to a user through the first display surface FS. The electronic apparatus ED may display the image IM toward the third direction DR3 on the first display surface FS parallel to each of the first direction DR1 and the second direction DR2. In the disclosure, a front surface (or an upper surface) and a rear surface (or a lower surface) of each component are defined with respect to a direction in which the image IM is displayed. The front surface and the rear surface oppose each other in the third direction DR3 and the normal direction of each of the front surface and the rear surface may be parallel to the third direction DR3.

In an embodiment, the electronic apparatus ED may include the first display surface FS and a second display surface RS. The first display surface FS may include a first active region F-AA, and a first peripheral region F-NAA. The first active region F-AA may include an electronic module region EMA. The second display surface RS may be defined as a surface opposing at least a portion of the first display surface FS. That is, the second display surface RS may be defined as a portion of a rear surface of the electronic apparatus ED.

In an embodiment, the electronic apparatus ED may sense an external input applied from the outside. The external input may include various forms of input provided from the outside of the electronic apparatus ED. In an embodiment, for example, the external input may include not only a contact by a part of a user's body, such as a hand, but also an external input applied in close proximity, or adjacent to the electronic apparatus ED at a predetermined distance (for example, hovering). In an embodiment, the external input may have various forms such as force, pressure, temperature, light, and the like.

The electronic apparatus ED may include a folding region FA1 and non-folding regions NFA1 and NFA2. In an embodiment, the electronic apparatus ED may include a first non-folding region NFA1 and a second non-folding region NFA2 disposed with the folding region FA1 interposed therebetween. FIG. 1A to FIG. 1C illustrate an embodiment where the electronic apparatus ED includes a single folding region FA1, but the embodiment is not limited thereto, and the electronic apparatus ED may have a plurality of folding regions.

Referring to FIG. 1B, an embodiment of the electronic apparatus ED may be folded or foldable with respect to a first folding axis FX1. The first folding axis FX1 is an imaginary axis extended in the first direction DR1, and the first folding axis FX1 may be parallel to a long side direction of the electronic apparatus ED. The first folding axis FX1 may be extended along the first direction DR1 on the first display surface FS.

In an embodiment, the non-folding regions NFA1 and NFA2 may be disposed adjacent to the folding region FA1 with the folding region FA1 interposed therebetween. In an embodiment, for example, the first non-folding region NFA1 may be disposed on one side of the folding region FA1 along the second direction DR2, and the second non-folding region NFA2 may be disposed on another side (or an opposing side) of the folding region FA1 along the second direction DR2.

The electronic apparatus ED may be folded or foldable with respect to the first folding axis FX1 and transformed into an in-folded state in which, in the first display surface FS, one region overlapping the first non-folding region NFA1 and another region overlapping the second non-folding region NFA2 face each other. In an embodiment, when the electronic apparatus ED in the in-folded state, the second display surface RS of the electronic apparatus ED may be visually recognized by a user. The second display surface RS may further include an electronic module region in which an electronic module including various components is disposed, and is not limited to any one embodiment.

Referring to FIG. 1C, an embodiment of the electronic apparatus ED may be folded or foldable with respect to the first folding axis FX1 and transformed into an out-folded state in which, in the second display surface RS, one region overlapping the first non-folding region NFA1 and another region overlapping the second non-folding region NFA2 face each other. However, the embodiment the embodiment of the invention is not limited thereto, and the electronic apparatus ED may be folded or foldable with respect to a plurality of folding axes such that a portion of each of the first display surface FS and the second display surface RS may be folded or foldable to face each other, and the number of folding axes and the number of non-folding regions in accordance therewith are not particularly limited.

The electronic module region EMA may include various electronic modules disposed therein. In an embodiment, for example, an electronic module may include at least one selected from a camera, a speaker, a light sensing sensor, and a heat sensing sensor. The electronic module region EMA may sense an external object received through the first or second display surface FS or RS, or may provide a sound signal such as voice to the outside through the first or second display surface FS or RS. An electronic module may include a plurality of components, and is not limited to any one embodiment.

Figure 2A:
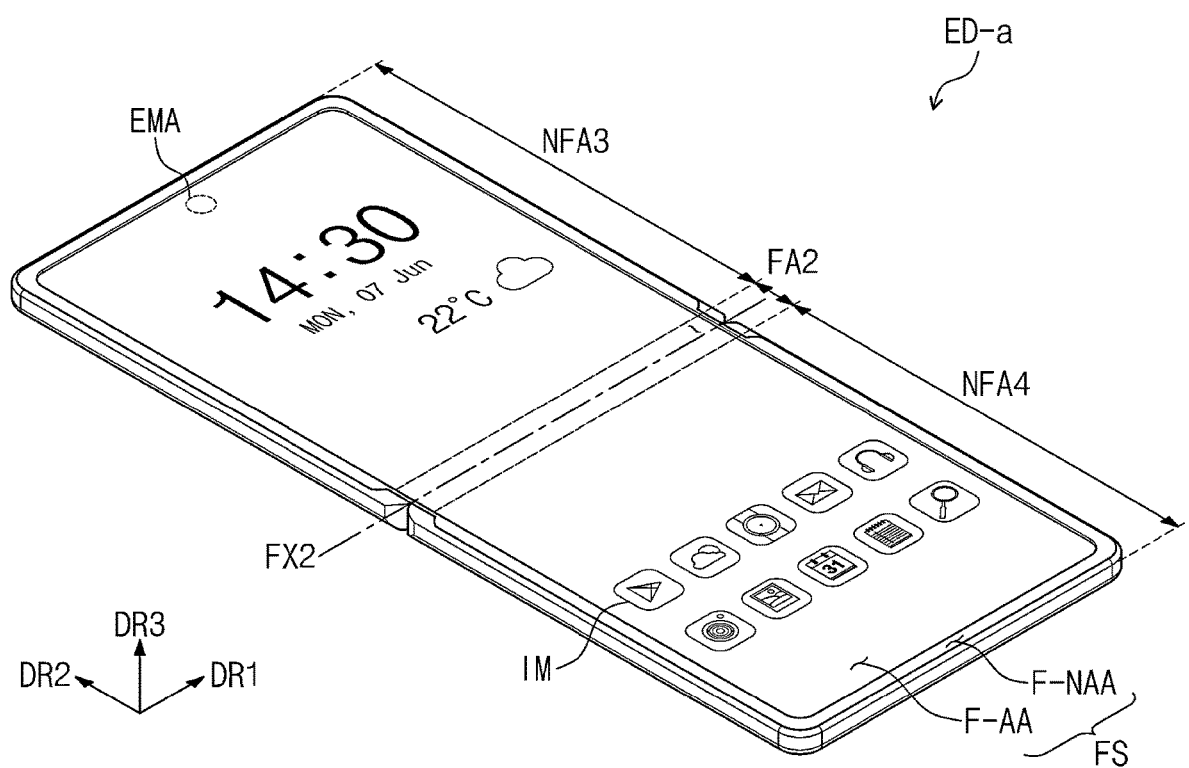
FIG. 2A is a perspective view showing an electronic apparatus in an unfolded state according to an embodiment.
Figure 2B:
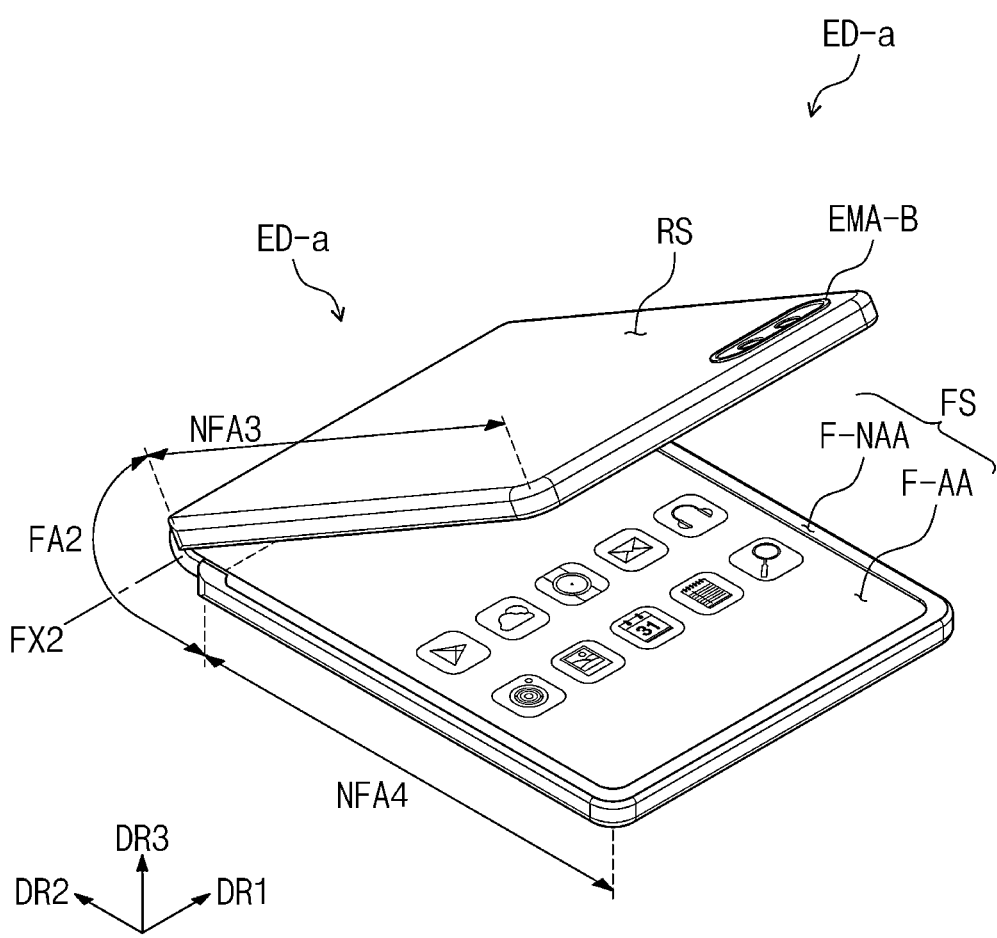
FIG. 2B is a perspective view showing an electronic apparatus of FIG. 2A in an in-folding process.

FIG. 2A is a perspective view showing an electronic apparatus in an unfolded state according to an embodiment. FIG. 2B is a perspective view showing an electronic apparatus of FIG. 2A in an in-folding process.

An embodiment of an electronic apparatus ED-a may be folded or foldable with respect to a second folding axis FX2 extended in one direction parallel to the first direction DR1. FIG. 2A and FIG. 2B illustrate an embodiment in which an extension direction of the second folding axis FX2 is parallel to an extension direction of a short side of the electronic apparatus ED-a. However, the embodiment is not limited thereto.

In an embodiment, the electronic apparatus ED-a may include at least one folding region FA2 and a plurality of non-folding regions NFA3 and NFA4 adjacent to the folding region FA2. The non-folding regions NFA3 and NFA4 may be disposed spaced apart from each other with the folding region FA2 interposed therebetween.

The folding region FA2 has a predetermined curvature and a predetermined radius of curvature when in the folded state. In an embodiment, a first non-folding region NFA3 and a second non-folding region NFA4 face each other, and the electronic apparatus ED-a may be in-folded such that the display surface FS is not exposed to the outside. In an embodiment, although not illustrated, the electronic apparatus ED-a may be out-folded such that the display surface FS is exposed to the outside. In an embodiment, the electronic apparatus ED-a includes a first display surface FS and a second display surface RS, and the first display surface FS may include an active region F-AA and a peripheral region F-NAA. In such an embodiment, the electronic apparatus ED-a may include electronic module regions EMA and EMA-B.

Embodiments of the electronic apparatuses ED and ED-a described with reference to FIG. 1A to FIG. 2B may be configured in a way such that from an unfolding operation, an in-folding operation or an out-folding operation repeats each other, but the embodiment is not limited thereto. In an embodiment, the electronic apparatuses ED and ED-a may be configured to selectively perform any one of an unfolding operation, an in-folding operation, and an out-folding operation. In an embodiment, although not illustrated, an electronic apparatus of an embodiment may be a flexible electronic apparatus which may include a plurality of folding regions, or at least some regions of which may be bendable or rollable.

Figure 3:
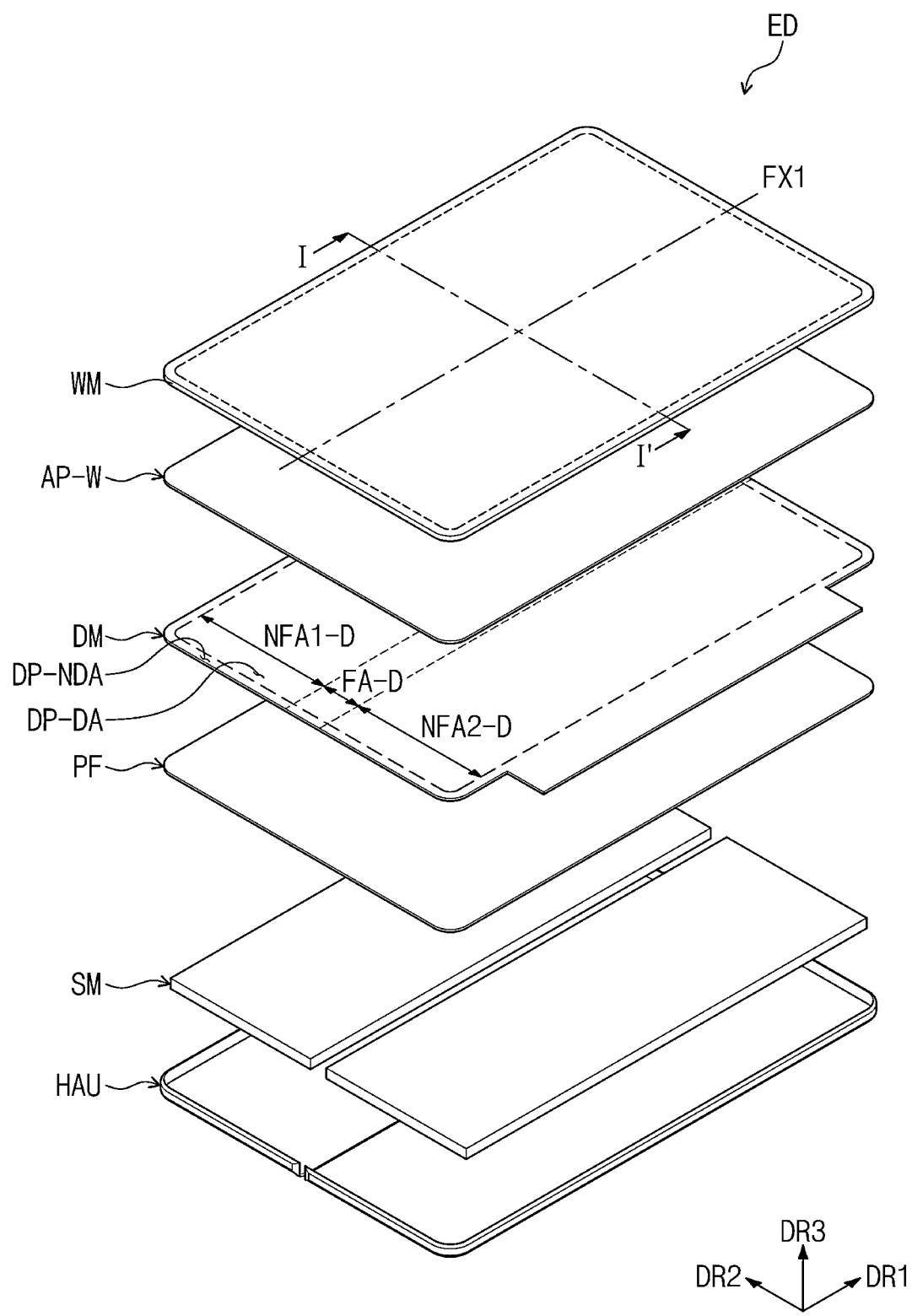
FIG. 3 is an exploded perspective view of an electronic apparatus according to an embodiment.
Figure 4:
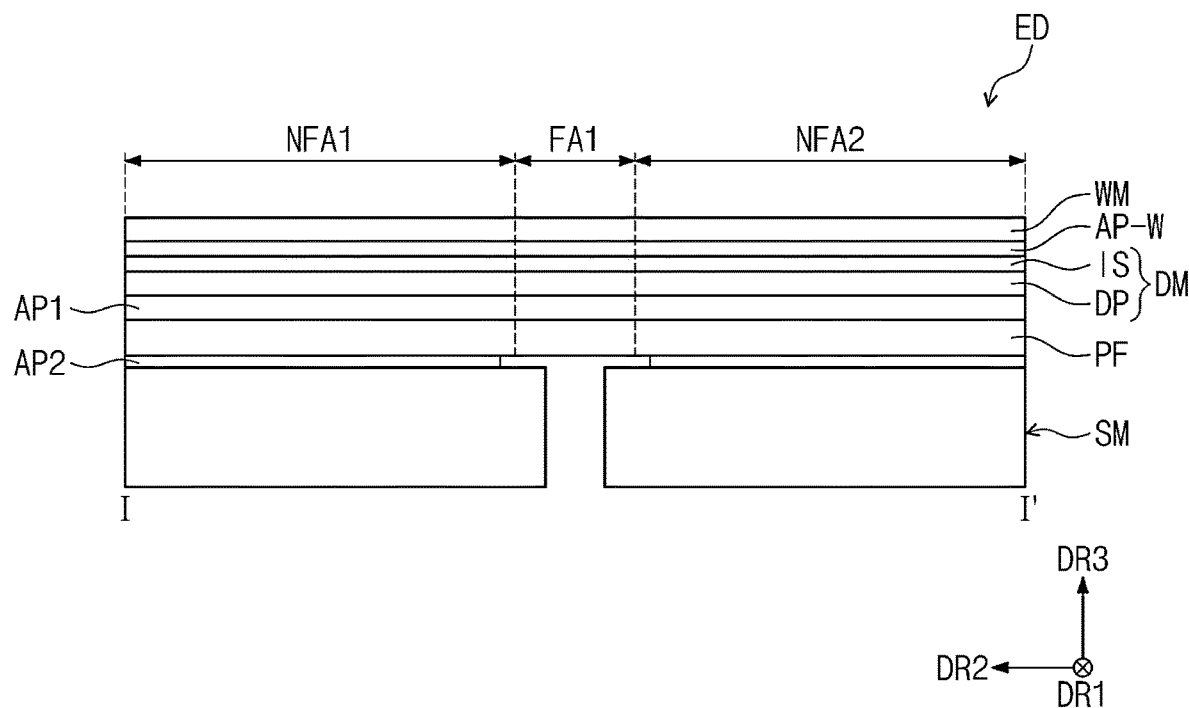
FIG. 4 is a cross-sectional view of an electronic apparatus according to an embodiment.

FIG. 3 is an exploded perspective view of an electronic apparatus according to an embodiment, and FIG. 4 is a cross-sectional view of an electronic apparatus according to an embodiment. Particularly, FIG. 3 illustrates an exploded perspective of an electronic apparatus of FIG. 1A, and FIG. 4 is a cross-sectional view showing a portion corresponding to line I-I' of FIG. 3.

Referring to FIG. 3 and FIG. 4, an embodiment of the electronic apparatus ED may include a display device and an electronic module (not shown) disposed on a lower side of the display device. The display device may include a display module DM, and a window WM disposed on the display module DM. The electronic module (now shown) may include a camera module. In an embodiment, a display device may include an adhesive layer AP-W disposed between the display module DM and the window WM, and a lower module SM and a support layer PF which are disposed on a lower side of the display module DM.

The window WM may cover the entire upper surface of the display module DM. The window WM may have a shape corresponding to the shape of the display module DM. The window WM may have flexibility which allows the window WM to be deformed in accordance with the folding or bending deformation of the electronic apparatus ED. In an embodiment, the window WM may serve to protect the display module DM from an external impact.

The electronic apparatus ED may include a housing HAU which accommodates the display module DM, the lower module SM, and the like. The housing HAU may be coupled to the window WM. Although not illustrated, the housing HAU may further include a hinge structure for facilitating folding or bending.

In an embodiment of the electronic apparatus ED, the adhesive layer AP-W disposed between the window WM and the display module DM may be an optically clear adhesive film ("OCA") or an optically clear adhesive resin layer ("OCR"). In an alternative embodiment, the adhesive layer AP-W may be omitted.

The display module DM displays an image in accordance with an electrical signal, and may transmit/receive information on an external input. The display module DM may include a display region DP-DA and a non-display region DP-NDA. The display region DP-DA may be defined as a region which emits an image provided from the display module DM.

The display module DM may include the display panel DP, and an input sensor IS disposed on the display panel DP.

The display panel DP may include a display device layer. In an embodiment, for example, the display device layer may include an organic electroluminescence device, a quantum dot luminescence device, or a liquid crystal device. However, the embodiment is not limited thereto.

The input sensor IS may include a plurality of sensing electrodes for sensing an external input. The input sensor IS may be a capacitive sensor, but is not particularly limited thereto. The input sensor IS may be directly formed on the display panel DP through a continuous process, when manufacturing the display panel DP. However, the embodiment of the invention is not limited thereto, and alternatively, the input sensor IS may be manufactured as a separate panel from the display panel DP, and be attached to the display panel DP by an adhesive layer (not shown).

In an embodiment of the electronic apparatus ED, the display module DM may include a folding display portion FA-D and non-folding display portion NFA1-D and NFA2-D. The folding display portion FA-D may be a portion corresponding to a folding region FA1 (see FIG. 1A), and the non-folding display portions NFA1-D and NFA2-D may be portions corresponding to a non-folding region NFA1 and NFA2 (see FIG. 1A).

In an embodiment, the window WM is disposed on the display module DM. The window WM may include an optically transparent insulation material. The window WM may protect the display panel DP, the input sensor IS, and the like. The image IM (see FIG. 1A) generated in the display panel DP may transmit the window WM and be provided to a user. The window WM may provide a touch surface of the electronic apparatus ED. In an embodiment of the electronic apparatus ED including the folding region FA1, the window WM may be a flexible window which is foldable or bendable.

Figure 5A:
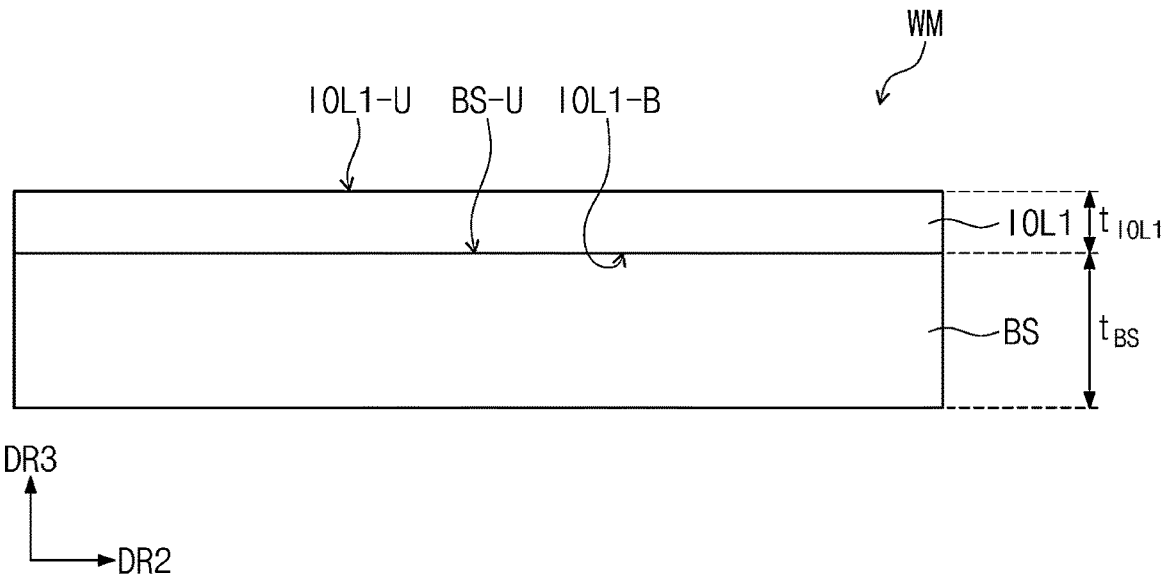
FIG. 5A is a cross-sectional view of a window according to an embodiment.

The window WM may include a polymer film as a base layer BS (see FIG. 5A). In an embodiment, the window WM may include the base layer BS (see FIG. 5A), and an inorganic film disposed on at least one selected from an upper surface and a lower surface of the base layer BS (see FIG. 5A). An embodiment of the window WM will be described in more detail later.

In an embodiment of the electronic apparatus ED, the lower module SM may include at least one selected from a support plate, a cushion layer, a shielding layer, a filling layer, and an interlayer bonding layer. The lower module SM may support the display module DM, or may prevent the deformation of the display module DM caused by external impact or force.

The support plate may include or be formed of a metal material or a polymer material. The cushion layer may include an elastomer such as sponge, foam, or a urethane resin. The shielding layer may be an electromagnetic wave shielding layer or a heat dissipating layer. In an embodiment, the shielding layer may serve as a bonding layer. The interlayer bonding layer may be defined by or provided in the form of a bonding resin layer or an adhesive tape. The filling layer may fill a space between the support layer PF and the housing HAU, and may fix the support layer PF.

The support layer PF may be disposed on a lower side of the display module DM to support a rear surface of the display module DM. The support layer PF may overlap the entire display module DM. The support layer PF may include a polymer material. In an embodiment, the support layer PF may be a polyimide ("PI") film or a polyethyleneterephthalate ("PET") film, for example, but the material of the support layer PF is not limited thereto.

In an embodiment, the electronic apparatus ED may further include at least one adhesive layer AP1 and AP2. In an embodiment, for example, a first adhesive layer AP1 may be disposed between the display module DM and the support layer PF, and a second adhesive layer AP2 may be disposed between the support layer PF and the lower module SM. At least one adhesive layer AP1 and AP2 may be an optically clear adhesive film ("OCA") or an optically clear adhesive resin layer ("OCR").

Figure 5B:
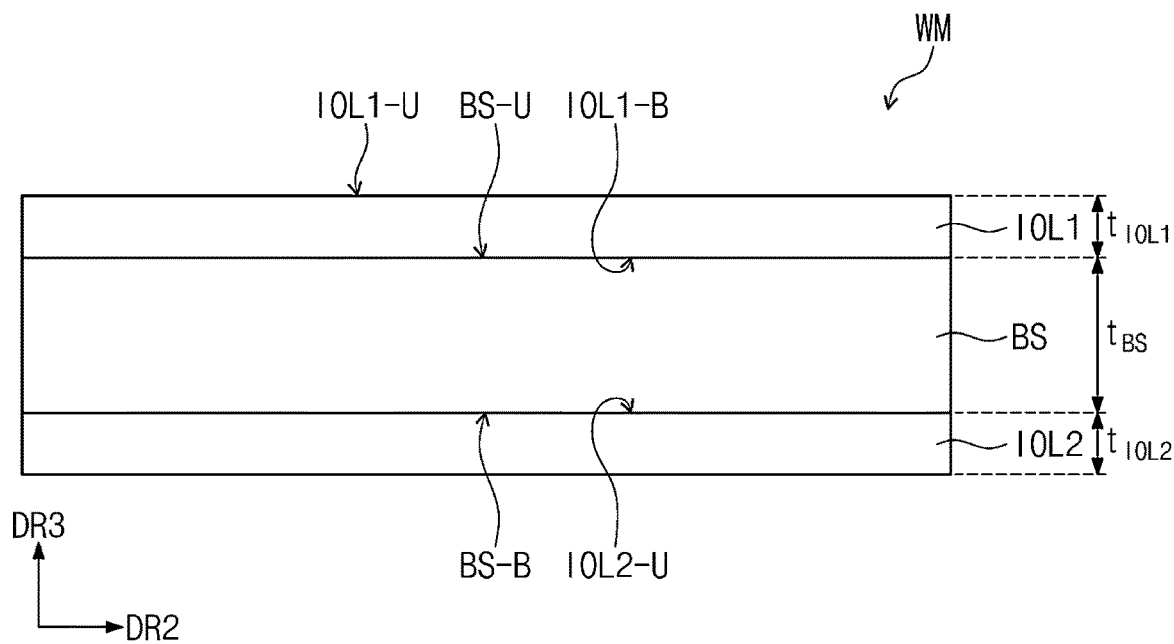
FIG. 5B is a cross-sectional view of a window according to an alternative embodiment.

FIG. 5A and FIG. 5B are each a cross-sectional view showing a window according to an embodiment. An embodiment of the window WM may include the base layer BS, and inorganic films IOL1 and IOL2 disposed directly on at least one selected from an upper surface BS-U and a lower surface BS-B.

Referring to FIG. 5A, the window WM may include the base layer BS and a first inorganic film IOL1 disposed on the base layer BS. The first inorganic film IOL1 may be disposed directly on the upper surface BS-U of the base layer BS. A lower surface IOL1-B of the first inorganic film IOL1 and the upper surface BS-U of the base layer BS may contact each other.

The base layer BS may include a material having a low moisture absorption rate. Therefore, to the base layer BS may effectively prevent external moisture from being absorbed into the base layer BS and diffused into the display module DM disposed below the window WM. In an embodiment, for example, the moisture absorption rate of the base layer BS may be about 1.0% or less, e.g., about 0.8% or less, or about 0.7% or less. It is possible to improve moisture permeability resistance of the window WM by controlling the moisture absorption rate of the base layer BS to be in the above-described range. The moisture absorption rate of the base layer BS may be measured through a moisture adsorption weight gravimetric method. In an embodiment, for example, the moisture absorption rate of the base layer BS may be a value calculated from changes in the weight of the base layer BS before and after being left to stand for a predetermined period of time under high-temperature and high-humidity conditions having a temperature in a range of about 60° C. to about 85° C. and a humidity in a range of about 70% to about 98%.

In an embodiment, the base layer BS may have a low water vapor transmission rate to prevent moisture and oxygen from penetrating into a device. The water vapor transmission rate of the base layer BS may be about 50 grams per square meter per 24 hours (g/m²·day) or less, e.g., about 45 g/m²·day or less. When the water vapor transmission rate of the base layer BS satisfies the above-described range, it is possible to effectively prevent external moisture and oxygen from penetrating into a device, so that device lifespan properties may be improved.

In an embodiment of the window WM, the base layer BS may be a polymer film. In an embodiment where the base layer BS is a polymer film, the base layer BS may include or be made of PET, polyacrylate, polymethylmethacrylate ("PMMA"), polycarbonate ("PC"), polyethylenenaphthalate ("PEN"), polyvinylidene chloride, polyvinylidene difluoride ("PVDF"), polystyrene ("PS)", an ethylene vinylalcohol copolymer, or a combination thereof, as a polymer satisfying the above-described moisture absorption rate and water vapor transmission rate conditions. However, the embodiment of the invention is not limited thereto.

In an embodiment, the base layer BS of the window WM may include PET. The base layer BS may include PET as a main component. In such an embodiment where the base layer BS includes PET as a main component, the window WM may have a low moisture absorption rate and a low water vapor transmission rate. In such an embodiment where the base layer BS has PET as a main component, the moisture absorption rate and water vapor transmission rate of the window WM may be lowered, so that the durability and reliability of the electronic apparatus ED (see FIG. 1A) may be improved.

In an embodiment, where the base layer BS includes PET as a main component, the base layer BS may include PET to such an extent as to allow desired properties of the window WM to be described later to be satisfied. In such an embodiment where the base layer BS includes PET as a main component, the content of PET in the base layer BS is about 80 mass percent (mass %) or greater, e.g., about 90 mass % or greater, or the base layer BS is composed of only the PET. In such an embodiment where the content of PET in the base layer BS satisfies the above-described range, it is possible for the window WM to exhibit desired properties, and the original moisture permeability resistance and durability of PET constituting the base layer BS may be improved.

A thickness $t_{BS}$ of the base layer BS may be in a range of about 30 micrometers (μm) to about 90 μm. If the thickness $t_{BS}$ of the base layer BS is less than about 30 μm, the base layer BS may not serve as a support layer provided with the first inorganic film IOL1 or to serve to protect the display module DM (see FIG. 3) and the like in a lower portion. In addition, if the thickness $t_{BS}$ of the base layer BS is greater than about 90 μm, the thickness of the entire electronic apparatus ED may be increased. Particularly, when the electronic apparatus ED (see FIG. 1A) is folded as illustrated in FIG. 1A to FIG. 2B, as the thickness of the base layer BS increases, the folding properties may be degraded.

In an embodiment, the window WM may include a single base layer BS. In an embodiment, for example, the window WM may include a single polymer film as the base layer BS. In such an embodiment, the window WM may not include an additional polymer film other than the base layer BS in contact with the first inorganic film IOL1.

In an embodiment of the window WM, the first inorganic film IOL1 may be provided as or defined by a single layer. In an embodiment of the window WM, the first inorganic film IOL1 may be, as a single layer, a functional layer serving to improve the durability of the window WM.

The base layer BS including a polymer film may be expanded or may have degraded physical properties due to moisture penetration, and thus, when applied to the electronic apparatus ED (see FIG. 1A), dimensional stability may be degraded. According to an embodiment of the invention, the first inorganic film IOL1 is disposed directly on the upper surface BS-U of the base layer BS, such that the expansion and physical properties degradation of the window WM due to moisture penetration may be effectively prevented, and the durability and reliability of the electronic apparatus ED (see FIG. 1A) may be further improved.

In an embodiment of the window WM, a thickness tom of the first inorganic film IOL1 may be in a range of about 10 nanometers (nm) to about 50 nm. If the thickness tom of the first inorganic film IOL1 is less than about 10 nm, barrier properties against moisture may be degraded, or ability to protect the base layer BS may be degraded, so that the durability of the window WM may be degraded. In addition, is the thickness tom of the first inorganic film IOL1 is greater than about 50 nm, the window WM becomes thicker, and thus, may not be suitable for the implementation of a thin electronic apparatus, or a foldable electronic apparatus.

In an embodiment of the window WM, the lower surface IOL1-B of the first inorganic film IOL1 may contact the upper surface BS-U of the base layer BS, and an upper surface IOL1-U of the first inorganic film IOL1 may be the uppermost surface exposed to the outside. Other layers may not be disposed on the first inorganic film IOL1. In such an embodiment, the window WM may not include an additional polymer film on an upper portion or a lower portion of the first inorganic film IOL1 other than the base layer BS.

The first inorganic film IOL1 may include at least one selected from silicon oxy carbide, silicon oxy carbonitride, and silicon oxide. In an embodiment, the first inorganic film IOL1 may include SiO, SiOC, SiOCN, or a combination thereof. Here, SiO refers to a material containing silicon atoms (Si) and oxygen atoms (O), SiOC refers to a material containing silicon atoms (Si), oxygen atoms (O), and carbon atoms (C), and SiOCN refers to a material containing silicon atoms (Si), oxygen atoms (O), carbon atoms (C), and nitrogen atoms (N).

In an embodiment, the first inorganic film IOL1 may include SiOCN. In an embodiment where the first inorganic film IOL1 includes SiOCN, the first inorganic film IOL1 may include, based on the total amount of atoms included in the first inorganic film IOL1, oxygen atoms of about 57.1 atomic percent (at %) to about 60.5 at %, silicon atoms of about 27.0 at % to about 30.6 at %, carbon atoms of about 6.0 at % to about 10.8 at %, and nitrogen atoms of about 3.4 at % to about 3.6 at %. In such an embodiment where the contents of oxygen atoms, silicon atoms, carbon atoms, and nitrogen atoms included in the first inorganic film IOL1 satisfy the above-described ranges, it is possible to maintain moisture permeability resistance and secure high mechanical properties when the first inorganic film IOL1 is applied to the window WM. In such an embodiment, it is possible to adjust the content ratios of atoms included in the first inorganic film IOL1 during a manufacturing process in accordance with desired properties of the window WM. The content ratios of atoms included in the first inorganic film IOL1 may be measured by X-ray photoelectron spectroscopy ("XPS"), but the embodiment of the invention is not limited thereto.

The first inorganic film IOL1 may be formed by various methods. In an embodiment, for example, the first inorganic film IOL1 may be formed by a method such as chemical vapor deposition ("CVD"), plasma enhanced chemical vapor deposition ("PECVD"), sputter, atomic layer deposition ("ALD"), or thermal evaporation. However, the embodiment of the invention is not limited thereto.

FIG. 5B is a cross-sectional view of the window WM according to an alternative embodiment of the invention. Hereinafter, the same reference numerals are given to the same or like components of the FIG. 5B as those described above with reference to FIG. 5A, and any repetitive detailed descriptions thereof will be omitted or simplified.

Referring to FIG. 5B, an embodiment of the window WM may include a base layer BS, the first inorganic film IOL1 disposed on the base layer BS, and a second inorganic film IOL2 disposed below the base layer BS. The first inorganic film IOL1 may be disposed directly on an upper surface BS-U of the base layer BS. A lower surface IOL1-B of the first inorganic film IOL1 and the upper surface BS-U of the base layer BS may contact each other. The second inorganic film IOL2 may be disposed directly on a lower surface BS-B of the base layer BS. A upper surface IOL2-U of the second inorganic film IOL2 and the lower surface BS-B of the base layer BS may contact each other.

In an embodiment, the window WM may include a single base layer BS. In an embodiment, the window WM may include a single polymer film. In such an embodiment, the window WM of an embodiment may not include an additional polymer film other than the base layer BS in contact with the first inorganic film IOL1 and the second inorganic film IOL2.

In an embodiment of the window WM, the first inorganic film IOL1 and the second inorganic film IOL2 may be provided as a single layer. In such an embodiment of the window WM, the first inorganic film IOL1 and the second inorganic film IOL2 may be, as a single layer, a functional layer serving to improve the durability of the window WM. In such an embodiment, the second inorganic film IOL2 may be disposed between the base layer BS and the display module DM (see FIG. 4) to additionally prevent moisture and oxygen from penetrating into a light emitting device.

In such an embodiment where the first inorganic film IOL1 and the second inorganic film IOL2 are disposed directly on the upper surface BS-U and the lower surface BS-B of the base layer BS, respectively, the expansion, or physical properties degradation of the window WM due to moisture penetration may be effectively prevented. Therefore, in such an embodiment, the dimensional stability of the window WM may be improved. In addition, the durability and reliability of the electronic apparatus ED (see FIG. 1A), to which the window WM is applied, may be further improved.

In an embodiment of the window WM, a thickness $t_{IOL2}$ of the second inorganic film IOL2 may be in a range of about 10 nm to about 50 nm. If the thickness $t_{IOL2}$ of the second inorganic film IOL2 is less than about 10 nm, barrier properties against moisture may be degraded, or ability to protect the base layer BS may be degraded, such that the durability of the window WM may be degraded. In addition, if the thickness $t_{IOL2}$ of the second inorganic film IOL2 is greater than about 50 nm, the window WM becomes thicker, and thus, may not be suitable for the implementation of a thin electronic apparatus, or a foldable electronic apparatus.

In an embodiment of the window WM, the lower surface IOL1-B of the first inorganic film IOL1 may contact the upper surface BS-U of the base layer BS, and an upper surface IOL1-U of the first inorganic film IOL1 may be the uppermost surface exposed to the outside. In such an embodiment, the window WM may not include an additional polymer film on an upper portion or a lower portion of the first inorganic film IOL1 other than the base layer BS.

The second inorganic film IOL2 may include at least one selected from silicon oxy carbide, silicon oxy carbonitride, and silicon oxide. In an embodiment, the second inorganic film IOL2 may include SiO, SiOC, SiOCN, or a combination thereof. In the disclosure, SiO refers to a material containing silicon atoms (Si) and oxygen atoms (O), SiOC refers to a material containing silicon atoms (Si), oxygen atoms (O), and carbon atoms (C), and SiOCN refers to a material containing silicon atoms (Si), oxygen atoms (O), carbon atoms (C), and nitrogen atoms (N).

In an embodiment, where the second inorganic film IOL2 includes SiOCN, the second inorganic film IOL2 may include, based on the total amount of atoms included in the second inorganic film IOL2, oxygen atoms of about 57.1 at % to about 60.5 at %, silicon atoms of about 27.0 at % to about 30.6 at %, carbon atoms of about 6.0 at % to about 10.8 at %, and nitrogen atoms of about 3.4 at % to about 3.6 at %. In such an embodiment where the contents of oxygen atoms, silicon atoms, carbon atoms, and nitrogen atoms included in the second inorganic film IOL2 satisfy the above-described ranges, high mechanical properties may be secured while maintaining moisture permeability resistance when the second inorganic film IOL2 is applied to the window WM. In such an embodiment, it the content ratios of atoms included of the second inorganic film IOL2 may be adjusted during a manufacturing process in accordance with desired properties of the window WM. The content ratios of atoms included in the second inorganic film IOL2 may be measured by XPS, but the embodiment of the invention is not limited thereto.

The second inorganic film IOL2 may be formed by various methods. In an embodiment, for example, the second inorganic film IOL2 may be formed by a method such as CVD, PECVD, sputter, ALD, or thermal evaporation. However, the embodiment of the invention is not limited thereto.

In general, an electronic apparatus is provided with a window for protecting a display module and the like. In a conventional electronic apparatus, a plastic substrate including a film including polyimide, and a hard coating layer disposed on one surface of the polyimide film may be used as a window. The polyimide film has high stability against heat and has high flexibility, and thus, has suitable properties as a material for a window applied to a flexible electronic apparatus. However, the polyimide film exhibits a relatively high moisture absorption amount according to humidity, and has a relatively large moisture expansion rate according to moisture absorption, so that cracks or peeling may occur in a window. Furthermore, in the case of the plastic film, it is extremely difficult to simultaneously satisfy mechanical properties desired as a window of an electronic apparatus and physical properties of not generating cracks in the window in various environments such as a high-temperature and high-humidity environment.

In an embodiment of the invention, the window WM is provided with the base layer BS including a polymer film, and an inorganic film IOL1 or IOL2 disposed directly on at least one selected from the upper surface BS-U and the lower surface BS-B of the base layer BS, and thus, may exhibit high mechanical properties while having a low moisture absorption rate, a low moisture expansion rate, and a low water vapor transmission rate in a high-temperature and high-humidity environment. In such an embodiment, the window WM has a low moisture absorption rate, a low moisture expansion rate, and a low water vapor transmission rate, and thus, may prevent moisture and oxygen from penetrating into a device in a high-humidity environment, and since a base film is capable of withstanding stress to expand and contract, dimensional changes due to an increase in moisture may be small. Accordingly, In an embodiment where the window WM is applied to the electronic apparatus ED (see FIG. 1A), the reliability and durability of the electronic apparatus ED (see FIG. 1A) may be improved.

According to an embodiment of the invention, the window WM may have a moisture absorption rate of about 2.7% or less. If a polymer material absorbs moisture, the polymer material may be expanded. The moisture expansion rate of each layer may not be the same as each other. In a case where the moisture expansion rate of the window WM and the moisture expansion rate of the display module DM (see FIG. 3) disposed in a lower portion of the window WM may be different from each other, cracks of the window WM, for example, crazing, may occur. In a case where a moisture absorption rate is greater than about 2.7%, the probability of the generation of cracks in the window WM may be increased. According to an embodiment of the invention, the window WM having a moisture absorption rate of about 2.7% or less may be applied to the electronic apparatus ED (see FIG. 1A). Therefore, the crack phenomenon of the window WM due to the difference in moisture expansion rates may be reduced.

In an embodiment, the moisture absorption rate of the window WM may be measured under a first condition. In an embodiment, the first condition may have a first temperature which is a high temperature, and a first humidity which is a high humidity. The first temperature of the first condition may be about 60° C. or higher, and the first humidity thereof may be about 70% or higher. In an embodiment, for example, the first temperature of the first condition may be about 60° C. to about 85° C., and the first humidity thereof may be about 70% to about 98%.

In an embodiment, a moisture adsorption weight gravimetric method may be used to measure the moisture adsorption rate of the window WM. Processes of measuring the moisture adsorption rate of the window WM may include preparing the window WM, drying the window WM under a second condition, and maintaining the window WM for a predetermined period of time under the first condition.

In a process of preparing the window WM, the window WM may be cut to a width of 1 centimeter (cm) and to a length of 1 cm. At this time, the weight of the window WM may be in a range of about 10 milligram (mg) to 30 mg, but is not limited thereto. Thereafter, the window WM is placed on a sample pan, and then residual moisture in the window WM may be removed under the second condition. In an embodiment, the second condition may have a second temperature and a second humidity. The second temperature may be about 60° C. or higher, and the second humidity may be about 0%. In an embodiment, for example, the second temperature may be in a range of about 60° C. to about 85° C., and the second humidity may be about 0%. The window WM may be dried for about 1 hour under the second condition.

Thereafter, the weight of the dried window WM may be measured. After the process of drying the window WM under the second condition, the window WM may have a first weight. That is, the first weight may be the weight of the window WM from which moisture has been removed.

Thereafter, the window WM may be maintained for a predetermined period of time under the first condition. The dried window WM may absorb moisture under the first condition. In an embodiment, for example, the window WM may be maintained for a predetermined period of time under the conditions with a temperature in a range of about 60° C. to about 85° C. and a humidity in a range of about 70% to about 98%. From the process of drying the window WM under the second condition to the process of maintaining the window WM for a predetermined period of time under the first condition, the temperature may be maintained constant. In an embodiment, for example, the second temperature of the second condition and the first temperature of the first condition may be the same as each other, but the embodiment of the invention is not limited thereto. After the window WM has been maintained for a predetermined period of time under the first condition, a second weight of the window WM is measured. The predetermined period of time may be, for example, about 3 hours.

The first weight may be the weight of the window WM before being under the first condition, and the second weight thereof may be the weight of the window WM after being maintained for a predetermined period of time under the first condition. The moisture absorption rate of the window WM may be a value in which a ratio of the value of the first weight, and the difference in values of the second weight and the first weight is represented as a percentage.

In an embodiment, the moisture absorption rate of the window WM may be represented by Equation 1 below.

$$M = \frac{W_w - W_d}{W_d} \times 100 \quad \text{[Equation 1]}$$

In Equation 1 above, M denotes the moisture absorption rate(%) of the window, $W_w$ denotes the weight of the window measured after being maintained for about 3 hours under a first condition, and $W_d$ denotes the weight of the window measured after being dried under a second condition with a second temperature and a second humidity.

According to an embodiment of the invention, the window WM may have a moisture expansion rate of about 8.03 parts per million per percent (ppm/%) or less. In such an embodiment where the moisture expansion rate satisfies the above-described range, the dimensional stability of the window WM in accordance with moisture absorption may be improved. In general, the window WM may expand in a high-humidity environment, and thus, the dimensions and shape thereof may be changed. According to an embodiment of the invention, the window WM has a moisture expansion rate of about 8.03 ppm/% or less, and thus, the dimensional stability of the window WM may be improved. Accordingly, in an embodiment where the window WM is applied to the electronic apparatus ED (see FIG. 1A), high durability and reliability may be ensured. In such an embodiment, even when a wet process is performed in a manufacturing process of the electronic apparatus ED (see FIG. 1A), the processability may be improved since the moisture expansion rate of the window WM is low. If the moisture expansion rate of the window WM does not satisfy the above-described range, the dimensions and shape of the window WM are changed with an increase in humidity, which may cause problems in that, such as, the window WM is bent, or peeled due to the degradation in adhesion with other functional layers.

In an embodiment, a dynamic mechanical analyzer ("DMA") may be used to measure the moisture expansion rate of the window WM. Processes of measuring the moisture expansion rate of the window WM may include preparing the window WM, drying the window WM under a second condition, and humidifying the window WM by changing from a second humidity to a first humidity at a first rate.

In the process of preparing the window WM, the window WM may be cut to a width of 6 millimeters (mm) and to a length of 10 mm. At this time, the length of the window WM may be measured. In the process of preparing the window WM, the window WM may have a first length. The first length may be referred to as an initial length of the window WM.

Under the second condition, residual moisture in the window WM may be removed. In an embodiment, the second condition may have a second temperature and a second humidity. The second temperature may be about 60° C. or higher, and the second humidity may be about 0%. In an embodiment, for example, the second temperature may be about 60° C., and the second humidity may be about 0%. However, the embodiment of the invention is not limited thereto. When the second humidity satisfies 0%, the second temperature may be appropriately selected according to measurement conditions. The window WM may be dried for about 1 hour under the second condition. The length of the dried window WM may be measured. In the process of drying the window WM, the window WM may have a second length. That is, the second length may be the length of the window WM from which moisture has been removed.

Thereafter, the process of humidifying the window WM may be performed. At this time, the second humidity of the second condition may be changed to the first humidity at the first rate. At this time, the temperature may be maintained constant. In an embodiment, the first humidity may be in a range of about 70% to about 98%, and the first rate may be about 1 percent per minute (%/min). In an embodiment, for example, while the temperature is being maintained constant, a humidity of about 0% may be changed to a humidity of about 90% at a rate of about 1%/min. The dried window WM may absorb moisture while being humidified and elongated. The length of the elongated window WM may be measured. The elongated window WM may have a third length. The moisture expansion rate of the window WM may be calculated from the amount of elongation of the window WM. In an embodiment, for example, the difference between the third length and the second length is divided by the difference in humidity to obtain a value, and then the value is divided by the initial length of the window WM to calculate a moisture expansion rate.

In an embodiment, the moisture expansion rate of the window WM may be represented by Equation 2 below.

$$H=((L_3-L_2/L_1)/(M_w-M_d))\times 10^6 \quad \text{[Equation 2]}$$

In Equation 2 above, H denotes the moisture expansion rate (ppm/%) of the window, $L_1$ denotes a first length, which is the initial length of the window WM, $L_2$ denotes a second length of the dried window WM measured under a second condition, $L_3$ denotes a third length of the elongated window WM after being humidified, $M_w$ denotes a first humidity, and $M_d$ denotes a second humidity.

In an embodiment, the window WM may have a low water vapor transmission rate to prevent moisture and oxygen from penetrating into a device. In an embodiment, the water vapor transmission rate of the window WM may be about 1.73 g/m²·day or less. At this time, the water vapor transmission rate of the window WM may be measured under a first condition with a first temperature, which is a high temperature, and a first humidity, which is a high humidity. In an embodiment, for example, the water vapor transmission rate may be measured after leaving the window WM to stand for a predetermined period of time under a temperature of about 60° C. and a humidity of about 100%.

In an embodiment, the window WM may have a thermal expansion coefficient of about 28.05 parts per million per degrees Celsius (ppm/° C.) or less. If the thermal expansion coefficient of the window WM is greater than about 28.05 ppm/° C., the difference in thermal expansion coefficients between the window WM and functional layers (e.g., a display module) disposed below the window WM may increase excessively in the manufacturing process of the electronic apparatus ED (see FIG. 1A). As described above, when the difference in thermal expansion coefficients increases, the possibility that the window WM and the display module DM are peeled from each other in the manufacturing process of the electronic apparatus ED (see FIG. 1A) may increase.

In an embodiment, a thermomechanical analyzer ("TMA") may be used to analyze a thermal expansion coefficient. Processes of measuring the thermal expansion coefficient of the window WM may include preparing the window WM, cooling the window WM under a third temperature condition, and heating the window WM from the third temperature condition to a condition of a fourth temperature, which is higher than a third temperature.

In the process of preparing the window WM, the window WM may be cut to a width of 4 mm and to a length of 16 mm. The window WM may be mounted on an analyzer such that a portion thereof may be exposed to heat. In an embodiment, for example, the length of the portion may be about 10 mm. At this time, the length of the window WM may be measured. In the process of preparing the window WM, the window WM may have a fourth length. The fourth length may be referred to as an initial length of the window WM.

The window WM may be cooled under the third temperature condition. The third temperature condition may be a low temperature condition. In an embodiment, for example, the window WM may be cooled to a temperature of about −50° C. The length of the cooled window WM may be measured. In the process of cooling the window WM, the window WM may have a fifth length. That is, the fifth length may be the length of the cooled window WM.

Thereafter, the process of heating the window WM may be performed. The window WM may be heated from the third temperature condition to the condition of a fourth temperature, which is higher than the third temperature. In an embodiment, for example, the temperature may be increased at a rate of 5° C. per minute from the temperature condition of about −50° C. to heat the window WM to a temperature condition of about 150° C. The window WM which has been cooled under the third temperature condition may be elongated due to heat while being heated under the fourth temperature condition. The length of the elongated window WM due to hear may be measured. The elongated window WM may have a sixth length. The thermal expansion coefficient of the window WM may be calculated from the amount of elongation of the window WM.

In an embodiment, the thermal expansion coefficient may be represented by Equation 3 below.

$$T=(((L_6-L_5)/L_4)/(T_4/T_3))\times 10^6 \quad \text{[Equation 3]}$$

In Equation 3 above, T denotes the thermal expansion coefficient (ppm/° C.) of the window WM, $L_4$ denotes a fourth length, which is the initial length of the window WM, $L_5$ denotes a fifth length of the window WM measured under a third condition, $L_6$ denotes a sixth length of the window WM under a fourth temperature condition, $T_3$ denotes a third temperature, and $T_4$ denotes a fourth temperature.

In an embodiment, the glass transition temperature (Tg) of the window WM may be about 87.2° C. or higher. If the glass transition temperature (Tg) of the window WM is less than about 87.2° C., environmental reliability problems may occur when the window WM is bent or folded. In the disclosure, the environmental reliability may mean properties in that the window WM is not broken when the window WM is bent or folded in a high-temperature environment. In an embodiment where the window WM having a glass transition temperature (Tg) of about 87.2° C. or higher is applied to the electronic apparatus ED (see FIG. 1A), environment reliability problems may be prevented, so that the durability of the electronic apparatus ED (see FIG. 1A) may be improved.

In an embodiment, the window WM includes the base layer BS including or formed of a polymer material, and an inorganic film IOL1 or IOL2 disposed directly on at least one selected from the upper surface BS-U and the lower surface BS-B of the base layer BS, and thus, may have flexibility suitable for a flexible electronic apparatus, and also, may exhibit moisture permeability resistance of protecting the display module DM, which is disposed below the window WM, from external moisture and oxygen. In an embodiment, the window WM exhibits excellent dimensional stability in a high-temperature and high-humidity environment, so that the crack phenomenon and peeling phenomenon of the window WM may be prevented. In an embodiment, the electronic apparatus ED (see FIG. 1A) includes the window WM on the display module DM, and thus, may exhibit high durability and reliability since changes in the dimensions and shape of the window WM may be minimized even in a use state in which a folding operation is repeated, while having high moisture permeability resistance.

Hereinafter, with reference to Examples and Comparative Examples, a window according to an embodiment of the invention will be described in further detail. In addition, Examples below are for illustrative purposes only to facilitate the understanding of embodiments of the invention, and thus, the scope of the invention is not limited thereto.

EXAMPLES

1. Manufacturing of Window

The compositions of windows of Examples and Comparative Examples are as shown in Table 1 below. Example 1 is a window including a base layer including polyethyleneterephthalate, and a first inorganic film and a second inorganic film disposed directly on an upper surface and a lower surface of the base layer, respectively. The window of Example 1 has a stacking structure illustrated in FIG. 5B. Comparative Example 1 is a window including only the base layer including polyethyleneterephthalate, and Comparative Example 2 is a window including a base layer including polyimide, and a hard coating layer disposed on an upper surface of the base layer.

TABLE 1

|  | Example 1 | Comparative Example 1 | Comparative Example 2 |
|---|---|---|---|
| Base layer | O (Polyethyleneterephthalate) | O (Polyethyleneterephthalate) | O (Polyimide) |
| Inorganic film | O | — | — |
| Hard coating layer | — | — | O |

1) Example 1

A PET film was prepared, and in a chemical vapor deposition manner, a first inorganic film and a second inorganic film which include Si, O, C, and N were formed respectively on one surface and the other surface of the PET film to manufacture a window. The compositions of the surfaces of the first inorganic film and the second inorganic film were analyzed by X-ray photoelectron Spectroscopy, and the results are shown in Table 2 below. Table 2 below shows the average value and standard deviation of the surface compositions for the first inorganic film and the second inorganic film.

TABLE 2

| | Composition ratio (at %) | Standard deviation |
|---|---|---|
| O | 58.8 | 1.7 |
| Si | 28.8 | 1.0 |
| C | 8.4 | 2.4 |
| N | 3.5 | 0.2 |

2) Comparative Example 1

A window was manufactured in the same manner as in Example 1 except that a first inorganic film and a second inorganic film were not respectively formed on an upper portion and a lower portion of a base layer. Comparative Example 1 corresponds to a PET film in which a first inorganic film and a second inorganic film are not provided. The PET film used in Example 1 and Comparative Example 1 are the Same Type.

3) Comparative Example 2

A polyimide film was prepared, and on one surface of the polyimide film, a polyacrylate resin including $Sb_2O_5$ as an antistatic agent was coated. Thereafter, ultraviolet (UV) light was radiated to cure the polyacrylate resin, and a hard coating layer was formed thereby.

2. Evaluation of Properties of Window (1) Moisture Absorption Rate

In Table 3, the moisture absorption rates of Examples and Comparative Examples were measured and shown. In Table 3, the moisture absorption rate was measured using a device (TAG-Sorption analysis Q5000 SA, TA Instruments Co., Ltd.). A test sample cut to a size of about 1.0 cm×1.0 cm (a weight of about 10 mg) was prepared when measuring the moisture absorption rate. The prepared test sample was placed on a spherical sample pan, and then mounted on an analyzer. Under the conditions of a temperature of about 60° C. to about 85° C. and a humidity of about 0%, a process of removing residual moisture in the sample was performed. Thereafter, while maintaining the temperature, the humidity was adjusted from about 70% to about 98% to analyze the amount of moisture absorbed by the sample through changes in weight. Table 3 shows moisture absorption rates calculated through Equation 1 above.

TABLE 3

| | Test sample 1 | Test sample 2 | Test sample 3 | Average (%) | Standard deviation |
|---|---|---|---|---|---|
| Example 1 | 0.497 | 0.472 | 0.474 | 0.48 | 0.014 |
| Comparative Example 1 | 0.549 | 0.650 | 0.548 | 0.58 | 0.059 |
| Comparative Example 2 | 2.839 | 2.808 | 2.743 | 2.80 | 0.049 |

Referring to Table 3 above, it can be confirmed that Example 1 has a low moisture absorption rate and high water resistance compared to Comparative Examples 1 and 2. When the moisture absorption rate is about 2.7% or less, the window WM may have high reliability in the presence of moisture. Therefore, in an embodiment where the window WM is applied to the electronic apparatus ED (see FIG. 1A), moisture may be effectively prevented from penetrating into a device, so that the durability and reliability of the electronic apparatus ED (see FIG. 1A) may be improved.

When comparing the results of Comparative Example 1 and Comparative Example 2, it can be confirmed that Comparative Example 1 including a PET film has a lower moisture absorption rate than Comparative Example 2 including a polyimide film, and exhibits a moisture absorption rate similar to that of Example 1. It can be confirmed that Comparative Example 2 including a polyimide film exhibits a high hygroscopicity as the humidity increases.

(2) Moisture Expansion Rate

In Table 4 and Table 5, the moisture expansion rates of Examples and Comparative Examples were measured and shown. In Table 4 and Table 5, the moisture expansion rate was measured using a DMA (Q800). A test sample cut to a size of about 10 mm×6 mm was prepared when measuring the moisture expansion rate. The prepared test sample was mounted on an analyzer, and the temperature was fixed at a specific temperature (about 30° C. or about 60° C.). Thereafter, while changing the humidity from about 0% up to about 90% at a rate of about 1% per minute, a load of about 0.05 N was applied to the test sample to measure changes in the amount of elongation. The moisture expansion rate was analyzed through changes in the amount of elongation of the test sample of a section from about 0% to about 90% in a linear section in which the humidity increased at each temperature. Table 4 and Table 5 show moisture expansion rates calculated through Equation 2 above. Table 4 below shows the moisture expansion rates of Examples and Comparative Examples measured at a temperature of about 60° C., and Table 5 below shows the moisture expansion rates of Examples and Comparative Examples measured at a temperature of about 30° C.

TABLE 4

| 60° C./90% | Test sample 1 (ppm/%) | Test sample 2 (ppm/%) | Average (ppm/%) | Standard deviation |
|---|---|---|---|---|
| Example 1 | 7.7 | 6.1 | 6.9 | 1.13 |
| Comparative Example 1 | 24.9 | 24.7 | 24.8 | 0.14 |
| Comparative Example 2 | 24.9 | 23.9 | 24.4 | 0.71 |

TABLE 5

| 30° C./80% | Test sample 1 (ppm/%) | Test sample 2 (ppm/%) | Average (ppm/%) | Standard deviation |
|---|---|---|---|---|
| Example 1 | 1.4 | 1.0 | 1.2 | 0.28 |
| Comparative Example 1 | 11.0 | 11.2 | 11.1 | 0.14 |
| Comparative Example 2 | 15.7 | 16.4 | 16.1 | 0.49 |

Referring to Table 4 and Table 5, it can be confirmed that Example 1 has a lower moisture expansion rate than Comparative Examples 1 and 2. The moisture expansion rate of Example 1 is about 8.03 ppm/% or less, so that the dimensional stability of the window WM in accordance with an increase in moisture may be improved. Accordingly, the crack phenomenon, peeling phenomenon, and the like of the window WM due to an increase in humidity may be prevented.

Comparative Example 1 includes only the base layer including polyethyleneterephthalate, so that it can be confirmed the moisture expansion rate thereof was increased compared to that of Example 1 due to an increase in moisture. On the other hand, in the case of Example 1, even though a base layer includes polyethyleneterephthalate, an inorganic film is respectively disposed on an upper portion and a lower portion of the base layer, such that the moisture expansion rate is significantly reduced.

Comparative Example 2 includes a base layer includes polyimide, so that it can be confirmed the moisture expansion rate thereof is significantly increased compared to that of Example 1.

(3) Water Vapor Transmission Rate

In Table 6, water vapor transmission rates of Examples and Comparative Examples were measured and shown. In Table 6, the water vapor transmission rate was measured using a water vapor transmission rate (WVTR) device. A test sample cut to a size of about 50 cm$^2$ was prepared when measuring the water vapor transmission rate. The water vapor transmission rate was measured under the conditions of a temperature of about 60° C., a humidity of about 100%, and a flow rate of about 100 standard cubic centimeters per minute (sccm).

TABLE 6

|  | Example 1 | Comparative Example 1 | Comparative Example 2 |
|---|---|---|---|
| Water vapor transmission rate (g/m$^2$ · day) | 1.7 | 42.1 | 168.4 |
| Standard deviation | 0.03 | 0.16 | 0.83 |

As shown in Table 6 above, Example 1 shows a low water vapor transmission rate compared to Comparative Examples 1 and 2. That is, Example 1 showed improved moisture barrier properties compared to Comparative Examples 1 and 2.

(4) Thermal Expansion Coefficient

In Table 7, the thermal expansion coefficients of Examples and Comparative Examples were measured and shown. In Table 7, the thermal expansion coefficient was measured using a thermomechanical analysis (TMA) device. A test sample was cut to a size of about 4 mm×16 mm when measuring the thermal expansion coefficient. The test sample may be mounted on the analysis device such that a portion thereof may be exposed to heat. In an embodiment, for example, the length of the portion may be about 10 mm. While applying a load of about 0.05 newton (N) to the test sample, the temperature was primarily dropped to about −50° C., and then the test sample was heated to about 90° C. at a rate of about 5° C. per minute to measure changes in the amount of elongation of the test sample. Thereafter, the temperature was secondarily dropped to about −50° C., and then the test sample was heated again to about 90° C. at a rate of about 5° C. per minute to measure changes in the amount of elongation of the test sample. It can be confirmed that the thermal expansion coefficient of a section of from about −40° C. to about 60° C. or from about −40° C. to about 85° C. in a linear section in which the primary and secondary temperatures increases. In an embodiment, for example, when a thermal expansion coefficient is about 25.4 ppm/° C., it can be understood that for each 1° C. increase, a test sample expands by 25.4 μm per meter.

TABLE 7

|  |  | First time CTE (ppm/° C.) | | Second time CTE (ppm/° C.) | |
|---|---|---|---|---|---|
|  | Number of times | −40 to 60° C. | −40 to 85° C. | −40 to 60° C. | −40 to 85° C. |
| Example 1 | Test sample 1 | 27.3 | 27.5 | 25.3 | 25.8 |
|  | Test sample 2 | 26.2 | 28.0 | 25.2 | 25.6 |
|  | Test sample 3 | 26.5 | 26.5 | 25.2 | 25.6 |
|  | Average | 26.7 | 27.3 | 25.2 | 25.7 |
|  | Deviation | 0.57 | 0.75 | 0.09 | 0.09 |

Referring to the results of Table 7 above, it can be confirmed that Example 1 has a low value of thermal expansion coefficient of about 28.05 ppm/° C. or less.

(5) Glass Transition Temperature

In Table 8, the glass transition temperatures of Examples and Comparative Examples were measured and shown. In Table 8, the glass transition temperature was measured using a DMA (Q800). A test sample was cut to a size of about 10 mm×6 mm and the mounted on an analyzer when measuring the glass transition temperature rate. The test sample was heated to about 200° C. at a temperature raising rate of about 3° C./min, and the maximum value of tan delta was confirmed as the glass transition temperature.

TABLE 8

|  | Glass transition temperature (° C.) | | | | |
|---|---|---|---|---|---|
|  | Test sample 1 | Test sample 2 | Test sample 3 | Average | Deviation |
| Example 1 | 87.2 | 91.2 | 88.6 | 89.0 | 2.01 |

Referring to the results of Table 8 above, it can be confirmed that Example 1 has a high value of glass transition temperature of about 87.2° C. or higher.

In an embodiment of the invention, a window includes a base layer, and an inorganic film disposed directly on at least one selected from an upper surface and a lower surface of the base layer, and thus, may exhibit high durability in a reliable environment.

In an embodiment of the invention, a display device includes a window disposed on an upper portion of a display module, where the window includes a base layer, and an inorganic film disposed directly on at least one selected from an upper surface and a lower surface of the base layer, and thus, may exhibit high durability in a reliable environment.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A window comprising:
a base layer; and
an inorganic film disposed directly on at least one selected from an upper surface and a lower surface of the base layer, wherein the inorganic film includes, silicon oxy carbonitride; and wherein the silicon oxy carbonitride inorganic film comprises based on a total amount of atoms included in the inorganic film:
oxygen atoms of 57.1 at % to 60.5 at %;
silicon atoms of 27.0 at % to 30.6 at %;
carbon atoms of 6.0 at % to 10.8 at %; and
nitrogen atoms of 3.4 at % to 3.6 at %, and
wherein the inorganic film includes one surface adjacent to the base layer, and the one surface of the inorganic film is entirely in contact with the base layer.

2. The window of claim 1, wherein the inorganic film comprises:
a first inorganic film disposed directly on the upper surface of the base layer; and
a second inorganic film disposed directly on the lower surface of the base layer.

3. The window of claim 1, wherein the base layer comprises polyethyleneterephthalate.

4. The window of claim 1, wherein a thickness of the inorganic film is in a range of 10 nm to 50 nm.

5. The window of claim 1, wherein a thickness of the base layer is in a range of 30 μm to 90 μm.

6. The window of claim 1, wherein
a moisture absorption rate of the window under a first condition with a first temperature and a first humidity is about 2.7% or less,
wherein the first temperature is 60° C. or higher, and the first humidity is 70% or higher.

7. The window of claim 6, wherein
the first temperature is 60° C. to 85° C., and
the first humidity is 70% to 98%.

8. The window of claim 6, wherein the moisture absorption rate of the window is a value measured after maintaining the window for 3 hours under the first condition.

9. The window of claim 6, wherein the moisture absorption rate of the window satisfies the following equation:

$$M = \frac{W_w - W_d}{W_d} \times 100$$

wherein,
M denotes the moisture absorption rate (%) of the window,
$W_w$ denotes a weight of the window measured after being maintained for 3 hours under the first condition, and
$W_d$ denotes a weight of the window measured after being dried under a second condition with a second temperature and a second humidity,
wherein the second temperature is 60° C. or higher, and the second humidity is 0%.

10. The window of claim 6, wherein, when changed from the second humidity to the first humidity at a first rate under a second condition with a second temperature and a second humidity, a moisture expansion rate is 8.03 ppm/% or less,
wherein the second temperature is 60° C. or higher, the second humidity is 0%, and the first rate is 1%/min.

11. The window of claim 6, wherein a water vapor transmission rate is 1.73 g/m² day or less under the first condition.

12. The window of claim 1, wherein a thermal expansion coefficient in a temperature range of −40° C. to 85° C. is 28.05 ppm/° C. or less.

13. The window of claim 1, wherein a glass transition temperature of the window is 87.2° C. or higher.

14. A display device comprising:
a display module; and
a window disposed on the display module,
wherein the window includes:
a base layer;
an inorganic film disposed directly on at least one selected from an upper surface and a lower surface of the base layer,
wherein the inorganic film includes silicon oxy carbonitride and wherein the silicon oxy carbonitride inorganic film comprises based on a total amount of atoms included in the inorganic film:
oxygen atoms of 57.1 at % to 60.5 at %;
silicon atoms of 27.0 at % to 30.6 at %;
carbon atoms of 6.0 at % to 10.8 at %; and
nitrogen atoms of 3.4 at % to 3.6 at %, and
wherein the inorganic film includes one surface adjacent to the base layer, and the one surface of the inorganic film is entirely in contact with the base layer.

15. The display device of claim 14, wherein the inorganic film comprises:
a first inorganic film disposed directly on the upper surface of the base layer; and
a second inorganic film disposed directly on the lower surface of the base layer.

16. The display device of claim 14, wherein the window has a moisture absorption rate of 2.7% or less,
wherein the moisture absorption rate of the window satisfies the following equation:

$$M = \frac{W_w - W_d}{W_d} \times 100$$

wherein
M denotes the moisture absorption rate (%) of the window,
$W_w$ denotes a weight of the window measured after being maintained for 3 hours under a first condition with a first temperature and a first humidity, and
$W_d$ denotes a weight of the window measured after being dried under a second condition with a second temperature and a second humidity,
wherein:
the first temperature is 60° C. or higher, and the first humidity is about 70% or higher; and
the second temperature is 60° C. or higher, and the second humidity is 0%.

* * * * *